United States Patent
Lee et al.

(10) Patent No.: US 11,094,511 B2
(45) Date of Patent: Aug. 17, 2021

(54) PROCESSING CHAMBER WITH SUBSTRATE EDGE ENHANCEMENT PROCESSING

(71) Applicant: Applied Materials, Inc., Santa Clara, CA (US)

(72) Inventors: Changhun Lee, San Jose, CA (US); Michael D. Willwerth, Campbell, CA (US); Valentin N. Todorow, Palo Alto, CA (US); Hean Cheal Lee, Santa Clara, CA (US); Hun Sang Kim, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 50 days.

(21) Appl. No.: 16/189,440

(22) Filed: Nov. 13, 2018

(65) Prior Publication Data

US 2020/0152431 A1    May 14, 2020

(51) Int. Cl.
*H01J 37/32*     (2006.01)
*G03F 7/42*      (2006.01)

(52) U.S. Cl.
CPC ........ *H01J 37/32862* (2013.01); *G03F 7/427* (2013.01); *H01J 37/32449* (2013.01)

(58) Field of Classification Search
CPC ........... H01J 37/32862; H01J 37/32449; H01J 37/3244; H01J 37/32642; H01J 37/32357; G03F 7/427
See application file for complete search history.

(56) References Cited

U.S. PATENT DOCUMENTS

| | | |
|---|---|---|
| 5,643,394 A | 7/1997 | Maydan et al. |
| 6,050,506 A | 4/2000 | Guo et al. |
| 6,372,150 B1 | 4/2002 | Wong et al. |
| 8,043,434 B2 | 10/2011 | Chebi et al. |

(Continued)

FOREIGN PATENT DOCUMENTS

| | | |
|---|---|---|
| JP | 2009531858 A | 9/2009 |
| KR | 101272334 B1 | 6/2013 |

OTHER PUBLICATIONS

International Search Report and Written Opinion from PCT/US2019/052169 dated Jan. 9, 2020.

*Primary Examiner* — Natasha N Campbell
(74) *Attorney, Agent, or Firm* — Patterson + Sheridan, LLP (57) ABSTRACT

Embodiments of the present disclosure generally provide an apparatus and methods for processing a substrate. More particularly, embodiments of the present disclosure provide a processing chamber having an enhanced processing efficiency at an edge of a substrate disposed in the processing chamber. In one embodiment, a processing chamber comprises a chamber body defining an interior processing region in a processing chamber, a showerhead assembly disposed in the processing chamber, wherein the showerhead assembly has multiple zones with an aperture density higher at an edge zone than at a center zone of the showerhead assembly, a substrate support assembly disposed in the interior processing region of the processing chamber, and a focus ring disposed on an edge of the substrate support assembly and circumscribing the substrate support assembly, wherein the focus ring has a step having a sidewall height substantially similar to a bottom width.

14 Claims, 5 Drawing Sheets

(56) References Cited

U.S. PATENT DOCUMENTS

| | | | |
|---|---|---|---|
| 8,057,633 B2 * | 11/2011 | Tsukamoto | H01L 21/6875 118/723 ER |
| 8,058,181 B1 | 11/2011 | Chen et al. | |
| 2004/0194268 A1 | 10/2004 | Halsey et al. | |
| 2004/0237997 A1 | 12/2004 | Rui et al. | |
| 2008/0035608 A1 * | 2/2008 | Thomas | C23C 16/45565 216/67 |
| 2010/0200016 A1 | 8/2010 | Yancey | |
| 2014/0034242 A1 * | 2/2014 | Sant | H01J 37/32715 156/345.51 |
| 2014/0224426 A1 * | 8/2014 | Kim | H01J 37/32091 156/345.51 |
| 2018/0144970 A1 | 5/2018 | Chuang et al. | |
| 2019/0333784 A1 * | 10/2019 | Lin | H01L 21/31116 |

* cited by examiner

PROCESSING CHAMBER WITH SUBSTRATE EDGE ENHANCEMENT PROCESSING

BACKGROUND

Field

Embodiments of the present disclosure generally relates to a method and apparatus for fabricating devices on a semiconductor substrate. More particularly, embodiments of the present disclosure provide method and apparatus for enhancing substrate edge processing performance for semiconductor applications.

Description of the Related Art

During manufacturing of semiconductor devices, a substrate is usually processed in a processing chamber, where deposition, etching, thermal processing may be performed to the substrate.

As the dimensions of the integrated circuit components are reduced (e.g. to sub-micron dimensions), the importance of reducing presence of contaminant has increased since such contaminant may lead to the formation of defects during the semiconductor fabrication process. For example, in an etching process, by-products, e.g., polymers that may be generated during the etching process, may become a source of particulate, contaminating integrated circuits and structures formed on the substrate. In some practices, such by-products are often found at certain locations of the substrate, such as an edge of the substrate.

A semiconductor processing chamber generally includes a chamber body defining an inner volume for processing the substrate. A substrate support is usually disposed in the inner volume to support the substrate during processing. During process, the reactive species generated during the process may not be uniformly distributed across the substrate surface. For example, the reactive species may not reach toward or extend to the edge of the substrate during process, thus resulting in substrate edge being under-processed, or having undesired contamination, buildups or by-products. Insufficient processing at the substrate edge may result in low etching or deposition rate at the substrate edge relative to the substrate center. Furthermore, in some examples, the reactive species may easily reach to a substrate center for processing but may not have enough momentum or energy to travel to the edge of the substrate for processing. As a result, different processing profiles may be obtained at the center and edge of the substrate, resulting in undesired non-uniform resultant profiles formed across the substrate.

Therefore, there is a need for a processing chamber having an enhanced processing performance to an edge of a substrate in the processing chamber.

SUMMARY

Embodiments of the present disclosure generally provide an apparatus and methods for processing a substrate. More particularly, embodiments of the present disclosure provide a processing chamber having an enhanced processing efficiency at an edge of a substrate disposed in the processing chamber. In one embodiment, a processing chamber comprises a chamber body defining an interior processing region in a processing chamber, a showerhead assembly disposed in the processing chamber, wherein the showerhead assembly has multiple zones with an aperture density higher at an edge zone than at a center zone of the showerhead assembly, a substrate support assembly disposed in the interior processing region of the processing chamber, and a focus ring disposed on an edge of the substrate support assembly and circumscribing the substrate support assembly, wherein the focus ring has a step having a sidewall height substantially similar to a bottom width.

In another embodiment, a showerhead plate having a plurality of apertures formed therein, wherein the showerhead plate has multiple zones with different aperture densities, wherein the zones located in a center region have an open area greater than the zones located in an edge region of the showerhead plate.

In yet another embodiment, a method for enhancing a substrate edge processing efficiency includes diverting a gas flow from a remote plasma source through a flow diverter to an edge zone of a showerhead assembly, and directing the gas flow through apertures in the edge zone of the showerhead assembly toward an edge of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation

DETAILED DESCRIPTION

Embodiments of the present disclosure provide a processing chamber and methods for enhancing processing efficiency at an edge portion of a substrate disposed in the processing chamber. More particularly, embodiments of the present disclosure relate to a processing chamber with certain embodiments of showerhead assembly, flow diverter, focus ring that enhance the processing efficiency at an edge of the substrate disposed in the processing chamber. In one embodiment, a showerhead assembly with an enhanced gas flow at an edge of the showerhead assembly may be utilized to assist carrying relatively higher amount of the reactive species to an edge of the substrate. A flow diverter may also be utilized to confine and direct the reactive species flowing path to the edge of the substrate. Furthermore, a focus ring with a desired profile is also used to provide an extended reactive flow path to the edge of the substrate.

Figure 1:
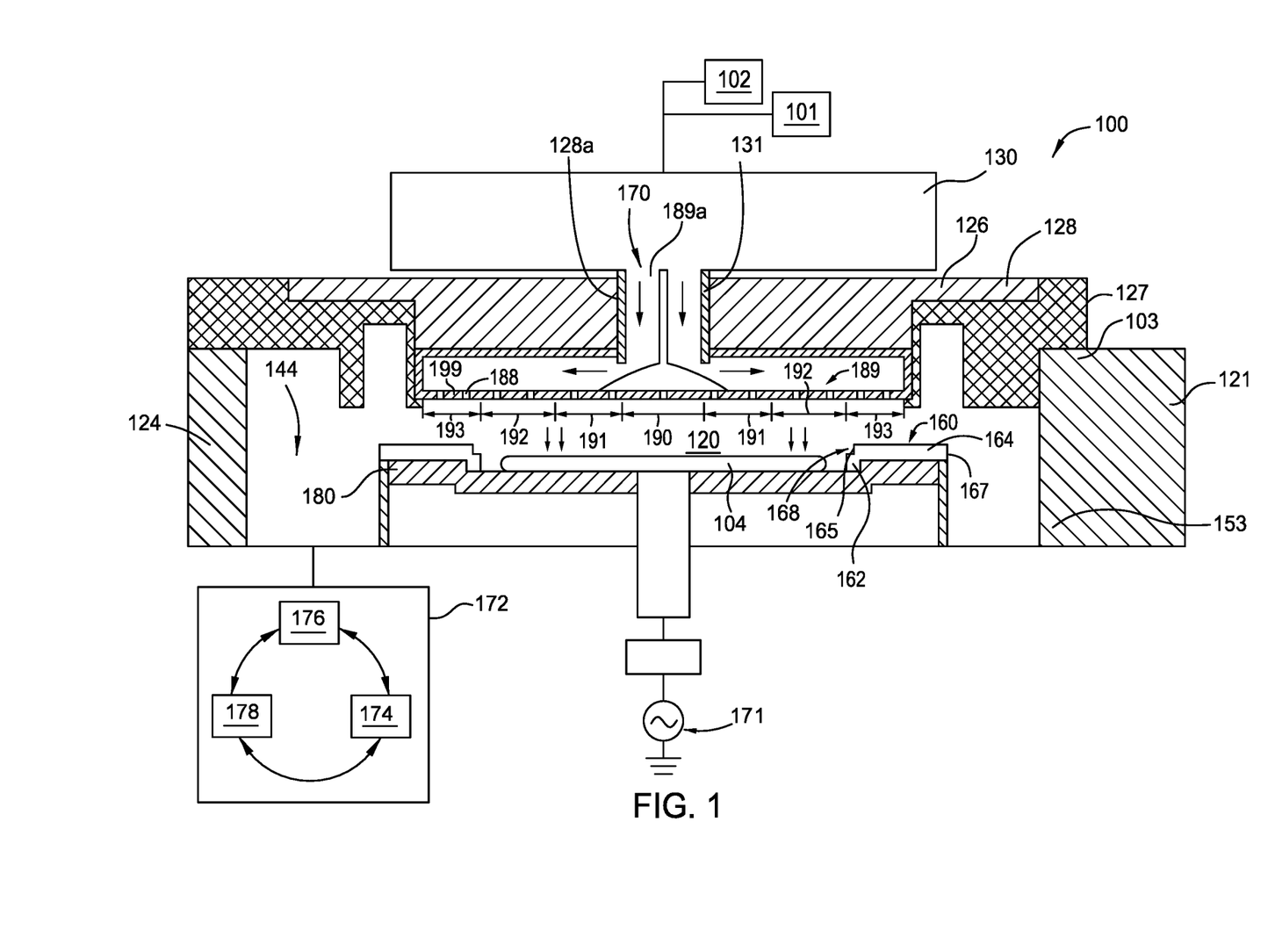
FIG. 1 is a schematic sectional view of a processing chamber according to one embodiment of the present disclosure.

FIG. 1 is a schematic sectional view of a processing chamber 100 according to one embodiment of the present disclosure. The processing chamber 100 includes an interior processing volume 120 for transferring and processing a substrate 104.

The processing chamber 100 includes a chamber body 121. In one embodiment, the chamber body 121 defines the interior processing volume 120. The processing chamber 100 comprises a showerhead assembly 189, a substrate support assembly 153 disposed within the processing volume 120. The showerhead assembly 189 is disposed over the substrate support assembly 153. The substrate support assembly 153 supports the substrate 104 in the interior processing volume 120 in the processing chamber 100.

A lid liner 127 disposed over a sidewall 103 of the chamber body 121 to provide profile sealing between the sidewall 103 and a ceiling 128 of the processing chamber 100. The lid liner 127 has a lip holding the showerhead assembly 189 and the ceiling 128. In one example, the ceiling 128 may be a source adapter plate 126. The source adapter plate 126 has a central opening 128a matches with a central opening 189a of the showerhead assembly 189. A remote plasma source 130 is in fluid communication with the interior processing volume 120 through a quartz insert 131 and the showerhead assembly 189.

The showerhead assembly 189 comprises a lower plate 199 having a plurality of apertures 188 formed therein. The lower plate 199 of the showerhead assembly 189 has multiple zones 190, 191, 192, 193 that have the apertures 188 formed therein with different densities and numbers. Details regarding the aperture distribution and profile in the showerhead assembly 189 will be further discussed below with reference to FIG. 4.

A flow diverter 170 is positioned through the central opening 189a of the showerhead assembly 189 above the lower plate 199. The flow diverter 170 diverts the gas flow from the remote plasma source 130 to different locations of the lower plate 199 so that the gas flow may further be directed through the apertures 188 to different locations of the substrate 104. The flow diverter 170 may have a predetermined geometric profile so as to enable the gas flow at certain directions. As a result, the gas flow at one direction may have a greater amount of flow flux than the others. In the example depicted in FIG. 1, the flow diverter 170 diverts the gas flow from the remote plasma source 130 to flow radically outward the outer zones 192, 193 (e.g., edge zones) of the showerhead assembly 189, rather than to the inner zones 190, 191 (e.g., center zones). Thus, in the example wherein an edge of the substrate 104 requires enhanced processing with higher flux density of reactive species, the flow diverter 170 may be utilized to direct the flow of the reactive species to the desired edge location of the substrate 104. Details of the configurations of the flow diverter 170 will be further discussed below with referenced to FIG. 5.

The remote plasma source 130 is generally connected to one or more gas panels. In one embodiment, the remote plasma source 130 is connected to a first gas panel 101 configured for providing processing gases for an abatement process to remove residual material after etching and a second gas panel 102 configured for providing processing gases for an ashing process to remove photoresist or any other residuals from the substrate 104.

The processing chamber 100 further includes the substrate support assembly 153 disposed in the interior processing volume 120 for supporting the substrate 104. A focus ring 160 may be disposed on an outer edge of the substrate support assembly 153. The focus ring 160 functions to retain the substrate 104 and also to modify processing rate around an edge area of the substrate 104 during processing. A base support 180 may be inserted between the focus ring 160 and the surface of the substrate support assembly 153 to help support the focus ring 160 with proper positioning. The focus ring 160 is positioned and formed in a manner to define a step 168 at a corner of the focus ring 160. The step 168 as defined may efficiently allow plasma or reactive species to flow in a direction close substrate bevel or substrate edge so as to assist reaction of the reactive species to the substrate edge or substrate bevel. More details of the focus ring 160 will be further described below with referenced to FIGS. 3A and 3B.

The substrate support assembly 153 is disposed within the chamber body 121 to support the substrate 104 during processing. The substrate support assembly 153 may be a conventional mechanical or electrostatic chuck with at least a portion of the substrate support assembly 153 being electrically conductive and capable of serving as a process bias cathode by a RF bias power source 171 coupled to the substrate support assembly 153. Substrates disposed on the substrate support assembly 153 may be raised and lowered by means of a wafer lift pins (not shown) to facilitate transfer of the substrate onto and off of the substrate support assembly 153.

The controller 172 includes a central processing unit (CPU) 174, a memory 176, and a support circuit 178 utilized to control the process sequence and regulate the gas flows and plasma process performed in the processing chamber 100. The CPU 174 may be of any form of a general purpose computer processor that may be used in an industrial setting. The software routines such as the process as practiced in the processing chamber 100 can be stored in the memory 176, such as random access memory, read only memory, floppy, or hard disk drive, or other form of digital storage. The support circuit 178 is coupled to the CPU 174 and may include cache, clock circuits, input/output systems, power supplies, and the like. Bi-directional communications between the controller 172 and the various components of the processing chamber 100 are handled through numerous signal cables collectively referred to as signal buses, some of which are illustrated in FIG. 1.

Figure 2:
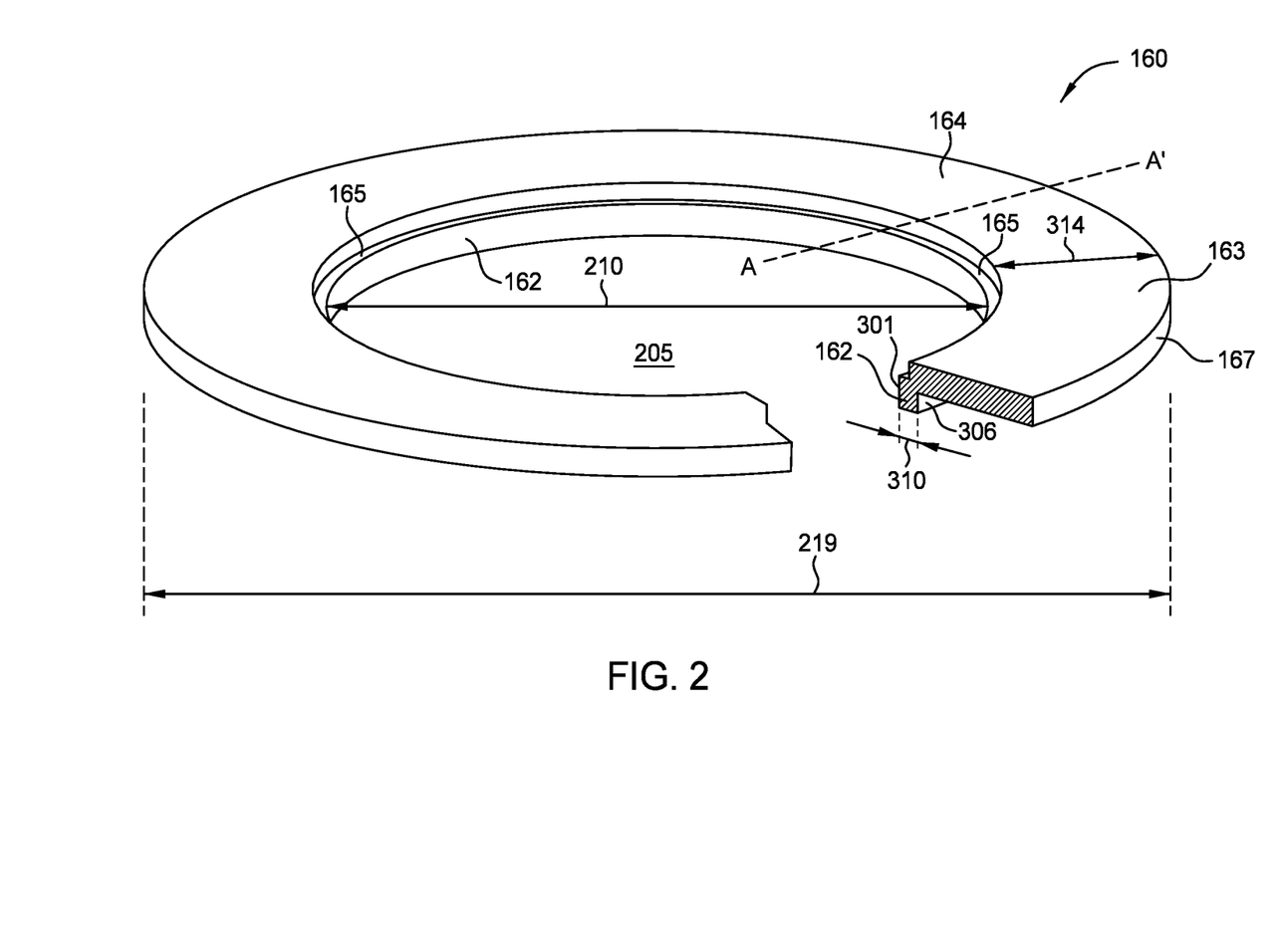
FIG. 2 is a schematic perspective view of a focus ring used in a processing chamber according to one embodiment of the present disclosure.

FIG. 2 is a schematic perspective view of one example of the focus ring 160 used in the processing chamber 100 according to one embodiment of the present disclosure. The focus ring 160 may be in form of a donut shape having a center opening 205. The center opening 205 has a diameter 210 accommodated to size the substrate 104 with the desired dimeter ranges (e.g., such as 200 mm, 300 mm, or 450 mm) positioned therein when placed around the substrate support assembly 153. In one example, the diameter 210 may be between about 11 inches and about 13 inches.

In one example, the focus ring 160 has an upper body 164 connected to a lower body 162. The upper body 164 has upper outer wall 167 and an upper inner wall 165. The upper inner wall 165 defines the diameter 210 of the opening 205. The upper outer wall 167 defines an outer perimeter of the focus ring 160. The upper outer wall 167 and the upper inner wall 165 are connected by a top surface 163 of the upper body 164. The top surface 163 of the upper body 164 defines a planar surface that is parallel to the upper surface of the substrate support assembly 153. The lower body 162 is connected to the upper body 164, forming a unitary body of the focus ring 160. In some examples, the lower body 162 and the upper body 164 may be separated and reassembled as needed, such as when installing in the processing chamber 100 to circumscribe the substrate support assembly 153.

The lower body 162 also includes a lower outer wall 306 and a lower inner wall 301. The lower outer wall 306 is formed inward from the upper outer wall 167 of the focus ring 160. In contrast, the lower inner wall 301 is formed extending outward from the upper inner wall 165 toward the center opening 205 of the focus ring 160. In one example, the focus ring 160 may be fabricated from a material comprising dielectric materials, such as aluminum nitride, aluminum oxide, aluminum oxynitride, or the like.

Figure 3A:
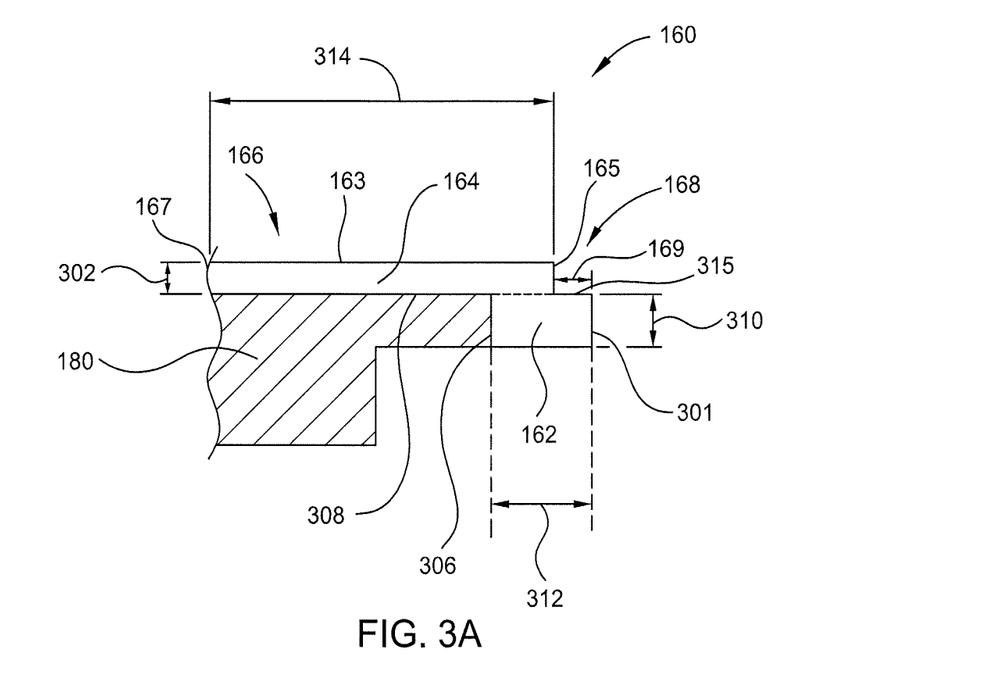
FIG. 3A-3B is a portion of a cross sectional view of the focus ring of FIG. 2 according to one embodiment of the present disclosure.

FIG. 3A depicts a cross sectional view of the focus ring 160 of FIG. 2 along the section lines A-A'. The step 168 of the focus ring 160 is defined between the upper inner wall 165 and an exposed surface 315 of the lower body 162. The upper body 164 may have a thickness 302 between about 0.25 inches and about 0.5 inches that defines a height of the step 168. In the example depicted in FIG. 3A, the upper inner wall 165 may have a substantially vertical surface that is perpendicular to the exposed surface 315 of the lower body 162. The upper inner wall 165 also defines a sidewall of the step 168. The lower body 162 has a thickness 310 (e.g., a height) between about 0.25 mm and about 1 inches that allows proper mating of the focus ring 160 to the base support 180 disposed on the substrate support assembly 153. The thickness 310 of the lower body 162 is thicker than the thickness 302 of the upper body 164. In one example, the thickness 310 of the lower body 162 is between about 20% and about 50% greater than the thickness 302 of the upper body 164.

The lower body 162 also has a width 312 in a range between about 1 inch and about 5 inches. The exposed surface 315 of the lower body 162 exposed by the upper body 164 has a width 169 between about 0.5 inch and about 5 inches that also defines the width of the step 168. The exposed surface 315 is also the bottom surface of the step 168. In one example, the thickness 302 (also the sidewall height of the step 168) is substantially similar or equal to the width 169 of the exposed surface 315 (also the bottom surface of the step 168). It is noted that the dimension of the step 168 formed in the focus ring 160 may be predetermined so as to allow enough space to assist flowing of the reactive species from the processing region 120 to the edge of the substrate disposed nearby. The step 168 may assist retain the reactive species for a longer time that can process the substrate edge or substrate bevel. The lower inner wall 301 is configured to be in contact, or in close proximity to the edge of the substrate 104 so as to assist retaining the substrate 104 at a desired location. The exposed surface 315 for the lower body 162 is substantially parallel to the top surface 163 of the upper body 164. The upper body 164 has a total width 314 between about 1 inch and about 5 inches.

Figure 3B:
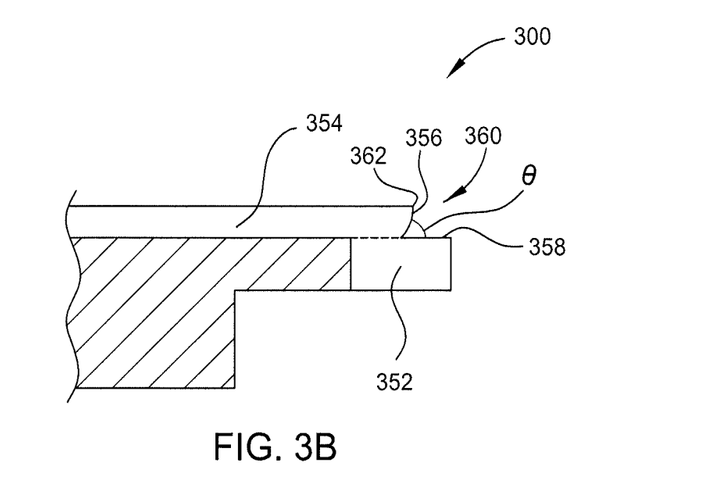

FIG. 3B depicts another example of a focus ring 300 that may be used to circumscribe the substrate support assembly 153 in the processing chamber 100. Similar to the focus ring 160 depicted in FIG. 3A, the focus ring 300 also has an upper body 354 and a lower body 352. A step 360 is formed between an upper inner wall 356 of the upper body 354 and an exposed surface 358 from the lower body 352. The focus ring 300 is similar in construction to the focus ring 160 of FIG. 3A, but the upper inner wall 362 of the focus ring 300 may be differently constructed. Unlike the substantially vertical upper inner wall 165 from the focus ring 160, the upper inner wall 356 of the focus ring 300 has a tilt surface 362, having an angle θ relative to the exposed surface 358 from the lower body 352. The angle θ is between about 20 degrees and about 110 degrees. It is believed that the tilt surface 362 of the upper inner wall 356 can help retain a greater amount of the reactive species in the step 360 so as to help the reaction at the edge or bevel of the substrate. The dimension of the upper body 354 and the lower body 352 of the focus ring 300 may be similar to or the same as the focus ring 160 depicted in FIG. 3A.

Figure 4:
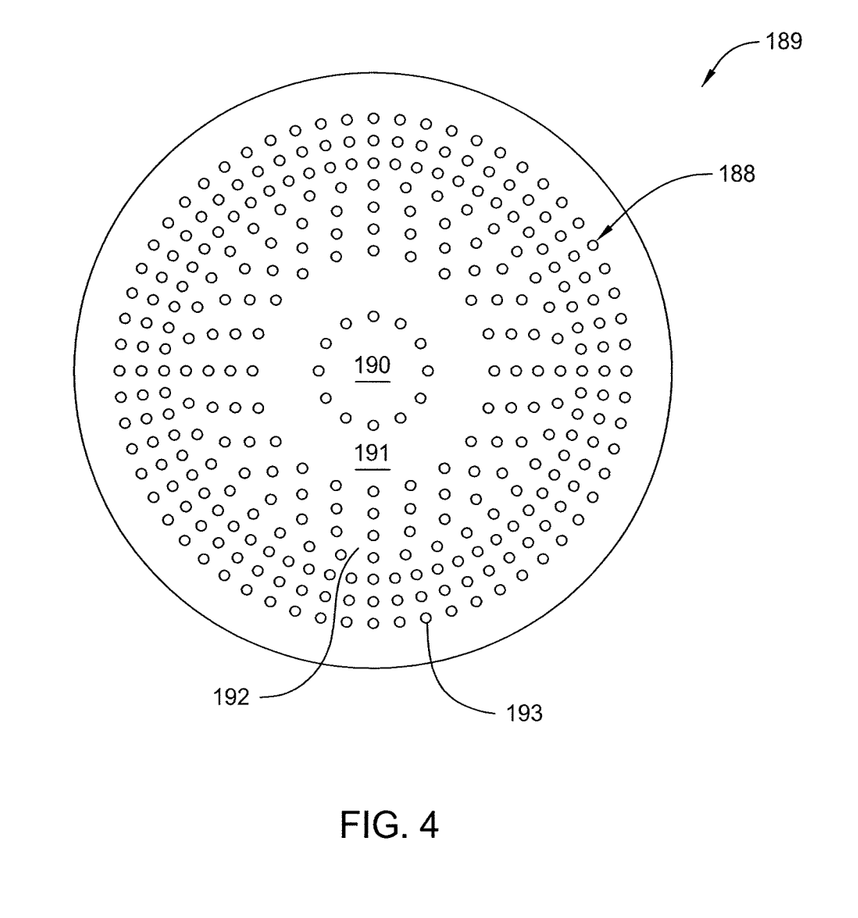
FIG. 4 is a bottom view of a showerhead assembly of FIG. 1 according to one embodiment of the present disclosure.

FIG. 4 depicted a bottom view of the showerhead assembly 189 of FIG. 1. The showerhead assembly 189 has multiple zones 190, 191, 192, 193 with different numbers and densities of the apertures 188 formed therein. At least two zones have different numbers of the apertures 188 formed in the showerhead assembly 189. Furthermore, in some embodiments, different zones may be made of different materials as needed. The zones 190, 191, 192, 193 can be formed in different geometric configurations or patterns, e.g., such as arranged in concentric rings, in a grid or slice pattern, or other combinations of different geometric shapes as needed. In some examples wherein an enhanced gas flow of reactive species is desired at an edge of the substrate 104, the edge zones 192, 193, where the edge of the substrate 104 faces to, may be configured to have higher density of the apertures. The densities of the zones 190, 191, 192, 193 may be gradually decreased (e.g., gradient) so as to control a relatively smaller amount of the reactive species supplied to the center zone 190, 191, as compared to the edge zone 192, 193. In some examples, the center zone 190, 191 may not have apertures. Thus, from the edge zone 193 to the center zone 190 (e.g., from the zone 193 to then the zone 192, the zone 191, and final to the zone 190), the open area is gradually increased so that the aperture numbers and densities are gradually reduced as needed. In one example, the aperture density is reduced or increased from about 2% to about 20% relative to each neighboring zone. The apertures in each zone may be aligned in a horizontal surface. The apertures formed in different zones may or may not be horizontally aligned.

Figure 5:
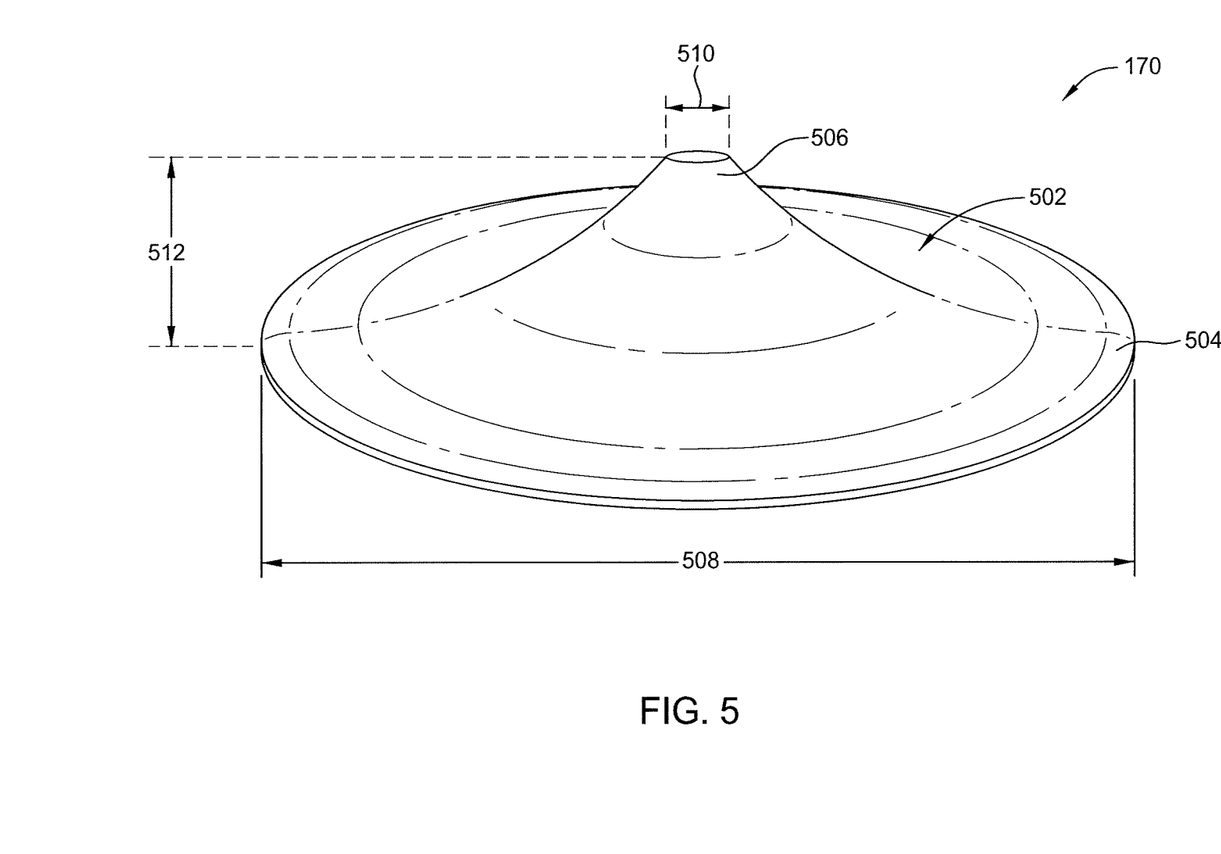
FIG. 5 is a perspective view of a flow diverter used in a showerhead assembly of FIG. 1 according to one embodiment of the present disclosure.

FIG. 5 depicts the flow diverter 170 that may be disposed in the processing chamber 100 above the lower plate 199 of the showerhead assembly 189. The flow diverter 170 may be positioned in direct contact with the lower plate 199 or slightly above the lower plate 199 with a desired distance spaced apart from the lower plate 199. The flow diverter 170 has a conical shape. The flow diverter 170 has a taper 502 towards the center, e.g., having one bottom end (or the base) 504 at the plane (or slight above the plane) of the lower plate 199 wider than a far or distal end 506, i.e., first dimension 508 being larger than a second dimension 510. It is noted that the degree of taper, shape or dimension of the flow diverter 170, as well as the shape, location and dimension of the flow diverter 170, may vary according to specific design and application needs, taking into considerations various factors such as the chamber dimension, pumping configuration, gas flow velocities, enhanced flow configuration and so on. Aside from achieving certain desired processing rate or uniformity results, the design parameters are selected to provide a process with relatively wide margins.

In one example, the bottom end 504 is circular in shape. The first dimension 508 is between about 1.5 inches and about 4 inches and the second dimension 510 is between about 0.05 inches and about 0.5 inches. In some embodiment, wherein the first dimension 508 is between about 20 times and about 40 times greater than the second dimension 510. The flow diverter 170 also has a height 512 (from the bottom end 504 to the distal end 506) between about 0.25 inches and about 1.5 inches. The flow diverter 170 may be made from a material comprising aluminum containing material.

In one example, the flow diverter 170 may be a solid body that does not allow the gas flow to flow therethrough (e.g. the taper 502 comprising a solid body formed from the bottom end 504 to the distal end 506). In another example, the flow diverter 170 is center hollow from the bottom end 504 to the distal end 506 (e.g. the taper 502 is a hallow body having a cavity formed from the bottom end 504 to the distal end 506) so as to allow open flow communication from the distal end 506 to the bottom end 504 when gases or reactive species are flowing therethrough. In the example wherein the flow diverter 170 is center hollow, the gases or reactive species from the remote plasma source 130 may be also directed to the center zone 190 where the center hollow is rest on.

In one embodiment, the gas flow from the gas panels 102, 101 is vertical flown downward through channel 155 (as shown in FIG. 1) connected to the flow diverter 170. The gas flow is then deflected or re-directed by the flow diverter 170 to the aperture 188 predominately at the edge zones 193, 192. Thus, the gas flow does not flow to the center zones 190, 191 with fewer or no apeatures. By adjusting the position, geometrical and dimension of the flow diverter 170, the spatial or lateral distribution of ions, neutral species and reactive species got passed by the flow diverter 170 can be controlled, which in turn, allows the substrate edge processing rate profile to be tuned. Although the flow diverter 170 is centrally located on or above the bottom plate 199 of the showerhead assembly 189 in the example depicted in FIG. 1, it can also be disposed at other locations, or be provided with different shapes and dimensions, in order to establish desired flow patterns that are suitable for other application needs. During processing, the process gases are ignited and formed as a remote plasma source from the remote chamber 130 to be supplied to the interior processing region 120.

Even though embodiments of the present disclosure are described above in application of processing chambers, embodiments of the present disclosure can be applied to any process chamber, such as load lock chamber or transfer chamber. Particularly, embodiments of the present disclosure are useful in applications desired to have enhanced substrate edge processing efficiency with enhanced processing rate at the substrate edge.

While the foregoing is directed to embodiments of the present disclosure, other and further embodiments of the disclosure may be devised without departing from the basic scope thereof, and the scope thereof is determined by the claims that follow.

What is claimed is:

1. A processing chamber, comprising:
a chamber body defining an interior processing region in a processing chamber; and
a showerhead assembly disposed in the processing chamber, wherein the showerhead assembly has at least four zones with different aperture densities, wherein the at least four zones includes a first zone in a center region and a second zone in an edge region wherein the first zone located in the center region does not have apertures and has an open area greater than the second zone located in the edge region of the showerhead assembly, and wherein each zone of the at least four zones has a greater aperture density than a zone of the at least four zones that is closer to a center of the showerhead assembly;
a substrate support assembly disposed in the interior processing region of the processing chamber; and
a focus ring disposed on an edge of the substrate support assembly and circumscribing the substrate support assembly, the focus ring comprising:
an inner perimeter and an outer perimeter;
an upper portion extending inwards from the outer perimeter to an upper inner wall, the upper portion having a top surface and a bottom surface;
a lower portion extending from the inner perimeter and having an upper surface and a lower surface, the upper surface extending to the upper inner wall and the lower surface extending below the bottom surface at the inner perimeter; and
a step formed from the upper inner wall intersecting the upper surface, wherein the upper inner wall has a height substantially similar to a length of the upper surface.

2. The processing chamber of claim 1 further comprising:
a flow diverter disposed above a lower plate of the showerhead assembly, wherein the flow diverter extends a height above the lower plate between about 0.25 inches and about 1.5 inches.

3. The processing chamber of claim 2 wherein the flow diverter is disposed in communication with a remote plasma source.

4. The processing chamber of claim 2, wherein the flow diverter has a base tapering upward to a distal end, wherein the base has a base length between about 1.5 inches and about 4 inches and the distal end has an end length between about 0.05 inches and about 0.5 inches.

5. The processing chamber of claim 2, wherein the flow diverter has a base tapering upward to a distal end and has a hollow from the base to the distal end.

6. The processing chamber of claim 5, wherein the base has a first dimension and the distal end has a second dimension, wherein the first dimension is greater than the second dimension.

7. The processing chamber of claim 6, wherein the first dimension is between about 20 times and about 40 times greater than the second dimension.

8. The processing chamber of claim 6, wherein the base is circular in shape.

9. The processing chamber of claim 2, wherein the flow diverter is fabricated from aluminum containing material.

10. The processing chamber of claim 1, wherein the step has a tilt sidewall.

11. The processing chamber of claim 1, wherein the focus ring has an upper body disposed on a lower body, wherein the lower body has a first thickness greater than a second thickness of the upper body.

12. The processing chamber of claim 11, wherein the upper body exposes a surface of the lower body, defining a bottom surface of the step.

13. The processing chamber of claim 1, wherein the focus ring is fabricated from aluminum containing material.

14. A showerhead assembly, comprising:
a showerhead plate having a plurality of apertures formed therein, wherein the showerhead plate has at least four zones with different aperture densities, wherein the at least four zones has a first zone in a center region and a second zone in an edge region, wherein the first zone located in the center region does not have apertures and has an open area greater than the second zone located in the edge region of the showerhead plate, wherein each of the at least four zones has a greater aperture density than that of an immediately adjacent zone of the at least four zones positioned closer to the center region.

\* \* \* \* \*